(12) United States Patent
Bowen et al.

(10) Patent No.: US 10,947,642 B1
(45) Date of Patent: Mar. 16, 2021

(54) SINGLE CRYSTALLINE $CS_2U_4O_{12}$ AND PROCESSES OF MAKING AND USING SAME

(71) Applicant: Government of the United States, as represented by the Secretary of the Air Force, Wright-Patterson AFB, OH (US)

(72) Inventors: Thomas A. Bowen, Beavercreek, OH (US); Eric J. Plummer, Beavercreek, OH (US); James M. Mann, Springboro, OH (US)

(73) Assignee: United States of America as represented by the Secretary of the Air Force, Wright-Patterson AFB, OH (US)

( * ) Notice: Subject to any disclaimer, the term of this patent is extended or adjusted under 35 U.S.C. 154(b) by 27 days.

(21) Appl. No.: 16/546,706

(22) Filed: Aug. 21, 2019

Related U.S. Application Data

(60) Provisional application No. 62/863,990, filed on Jun. 20, 2019.

(51) Int. Cl.
| | | |
|---|---|---|
| *C30B 7/10* | (2006.01) | |
| *C30B 29/60* | (2006.01) | |
| *C30B 29/16* | (2006.01) | |

(52) U.S. Cl.
CPC ............... *C30B 29/60* (2013.01); *C30B 7/10* (2013.01); *C30B 29/16* (2013.01)

(58) Field of Classification Search
CPC .... C30B 7/00; C30B 7/10; C30B 7/14; C30B 29/22
See application file for complete search history.

(56) References Cited

U.S. PATENT DOCUMENTS

| | | |
|---|---|---|
| 9,670,958 B2 | 6/2017 | Mann et al. |
| 9,903,041 B2 | 2/2018 | Mann et al. |
| 9,909,229 B2 | 3/2018 | Mann et al. |
| 2018/0171505 A1 | 6/2018 | Mann et al. |

OTHER PUBLICATIONS

Van den Berghe et al "Study of the pyrochlore-related structure of Cs2U4O12 by powder neutron and X-ray diffraction" Solid State Sciences 4 9(2002) 1257-1264.*

(Continued)

*Primary Examiner* — Robert M Kunemund
(74) *Attorney, Agent, or Firm* — AFMCLO/JAZ; James F. McBride

(57) ABSTRACT

The present invention relates to single crystalline $Cs_2U_4O_{12}$, hydrothermal growth processes of making such single crystals and methods of using such single crystals. In particular, Applicants disclose single crystalline $Cs_2U_4O_{12}$ having a $P2_1/c$ structure and a process of making and using same. Unlike other single crystalline $Cs_2U_4O_{12}$ structures the $P2_1/c$ structure has a different set of atomic coordinates which gives a different framework which in turn provides the altered performance of such single crystals.

9 Claims, 10 Drawing Sheets

(56) References Cited

OTHER PUBLICATIONS

Van den Berghe et al, "the local uranium environment in cesium urantes: a combined XPS XAS XRD and neutron diffraction analysis" Journal of Solid State Chemistry 166 320-329 (2002).*

Buddhadev Kanrar, N. M.; Misra, N. L.; Sastry, P. U.; Dube, V.; Ravikumar, G.; Magnetic Measurements on T±- Cs2U4O12. AIP Conference Proceedings, 2014, 1591, 131-132.

Van Egmond, A. B.; Investigations on Cesium Urantes-III Crystal Structure of Cs2U4O12. Journal of Inorganic Nuclear Chemistry, 1975, 37, 1929-1931.

Sven Van Den Berghe, M. V.; Verwerft, M.; Laval, J. P.; Gaudreau, B.; Allen, P. G.; Van Wyngardenz, A.; The Local Uranium Environment in Cesium Uranates: A Combined XPS, XAS, XRD, and Neutron Diffraction Analysis. Journal of Solid State Chemistry, 2002, 166, 320-329.

Van Den Berghe, S.; Laval, J.P.; Verwerfta, M.; Gaudreau, B.; Suard, E.; Study of the pryochlore-related structure of i±- Cs2U4O12 by powder neutron and X-ray diffraction. Solid State Sciences, 2002, 4, 1257-1264.

Cordfunke, E. H. P.; Van Egmond, A. B.; Van Voorst, G.: Investigations on Cesium Urantes-I Crystal Structure of Cs2U4O12. Journal of Inorganic Nuclear Chemistry, 1975, 37, 1933-1936.

Mann et al. Unpublished U.S. Appl. No. 16/238,599.

* cited by examiner

SINGLE CRYSTALLINE CS₂U₄O₁₂ AND PROCESSES OF MAKING AND USING SAME

CROSS-REFERENCE TO RELATED APPLICATION

The present application claims priority to U.S. Provisional Application Ser. No. 62/863,990 filed Jun. 20, 2019, the contents of which is hereby incorporated by reference in their entry.

RIGHTS OF THE GOVERNMENT

The invention described herein may be manufactured and used by or for the Government of the United States for all governmental purposes without the payment of any royalty.

FIELD OF THE INVENTION

The present invention relates to single crystalline $Cs_2U_4O_{12}$, hydrothermal growth processes of making such single crystals and methods of using such single crystals.

BACKGROUND OF THE INVENTION

The geometry of crystal structures are described by their space group which in turn is determined by their unit cell and atomic coordinates. Available single crystals do not offer the combination and range of properties desired for neutron detection, radiation resistance in electronics, and magnetic applications. Applicants recognized that in order to achieve a change in properties, the crystal structure of current single crystals such $Cs_2U_4O_{12}$ needed to be altered and that such alteration would require a novel hydrothermal growth process. Thus, Applicants disclose single crystalline $Cs_2U_4O_{12}$ having a $P2_1/c$ structure and a new process of making and using same. Unlike other single crystalline $Cs_2U_4O_{12}$ structures, the $P2_1/c$ structure of Applicants' $Cs_2U_4O_{12}$ has a different set of atomic coordinates which gives results in a novel crystalline framework which in turn provides the desired combination and range of properties.

SUMMARY OF THE INVENTION

The present invention relates to single crystalline $Cs_2U_4O_{12}$, hydrothermal growth processes of making such single crystals and methods of using such single crystals. In particular, Applicants disclose single crystalline $Cs_2U_4O_{12}$ having a $P2_1/c$ structure and a process of making and using same. Unlike other single crystalline $Cs_2U_4O_{12}$ structures the $P2_1/c$ structure has a different set of atomic coordinates which gives a different framework which in turn provides the altered performance of such single crystals.

Additional objects, advantages, and novel features of the invention will be set forth in part in the description which follows, and in part will become apparent to those skilled in the art upon examination of the following or may be learned by practice of the invention. The objects and advantages of the invention may be realized and attained by means of the instrumentalities and combinations particularly pointed out in the appended claims.

BRIEF DESCRIPTION OF THE DRAWINGS

The accompanying drawings, which are incorporated in and constitute a part of this specification, illustrate embodiments of the present invention and, together with a general description of the invention given above, and the detailed description of the embodiments given below, serve to explain the principles of the present invention.

DETAILED DESCRIPTION OF THE INVENTION

Definitions

Unless specifically stated otherwise, as used herein, the terms "a", "an" and "the" mean "at least one".

As used herein, the terms "include", "includes" and "including" are meant to be non-limiting.

Unless otherwise noted, all component or composition levels are in reference to the active portion of that component or composition, and are exclusive of impurities, for example, residual solvents or by-products, which may be present in commercially available sources of such components or compositions.

All percentages and ratios are calculated by weight unless otherwise indicated. All percentages and ratios are calculated based on the total composition unless otherwise indicated.

Unless otherwise noted, the written notation of the unit cell and atomic coordinates is designed via a number and an optional second number next to the first number in parenthesis, for example, 7.9400(16). This is understood by those in the art to have a value of 7.9400 plus or minus 0.0016.

It should be understood that every maximum numerical limitation given throughout this specification includes every lower numerical limitation, as if such lower numerical limitations were expressly written herein. Every minimum numerical limitation given throughout this specification will include every higher numerical limitation, as if such higher numerical limitations were expressly written herein. Every numerical range given throughout this specification will include every narrower numerical range that falls within

DETAILED DESCRIPTION OF THE INVENTION

Single Crystalline $Cs_2U_4O_{12}$

Figure 7A:
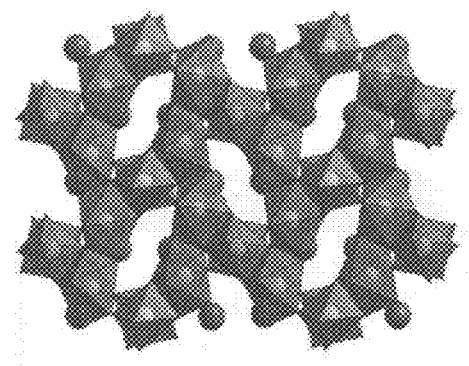
FIGS. 7A-7G are views down the a, b and c axis's of the $P2_1/c$, R3-H, and Fd3-m crystal structures of $Cs_2U_4O_{12}$ crystals.
Figure 7B:
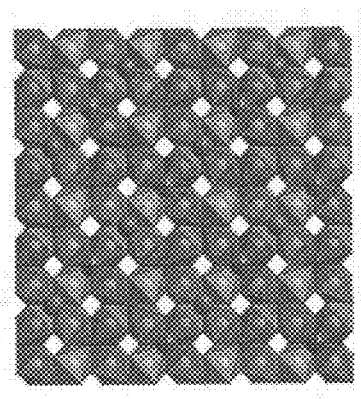
Figure 7C:
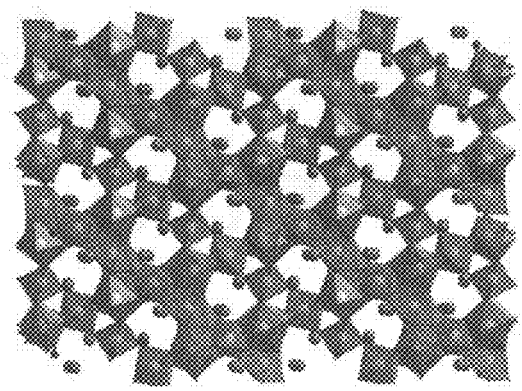
Figure 7D:
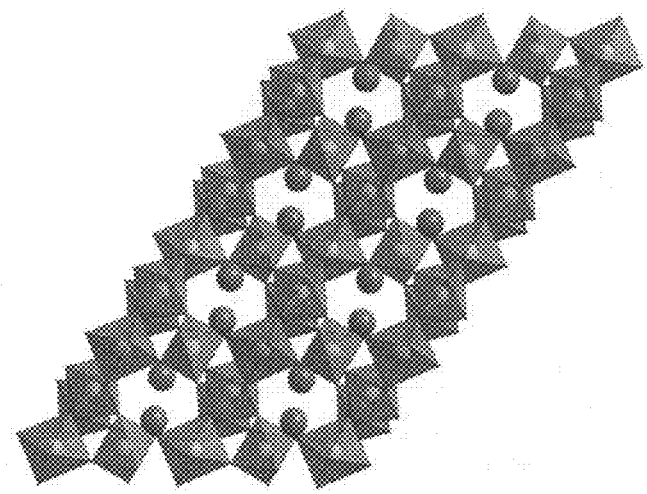
Figure 7E:
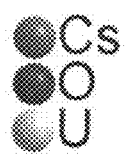
Figure 7E:
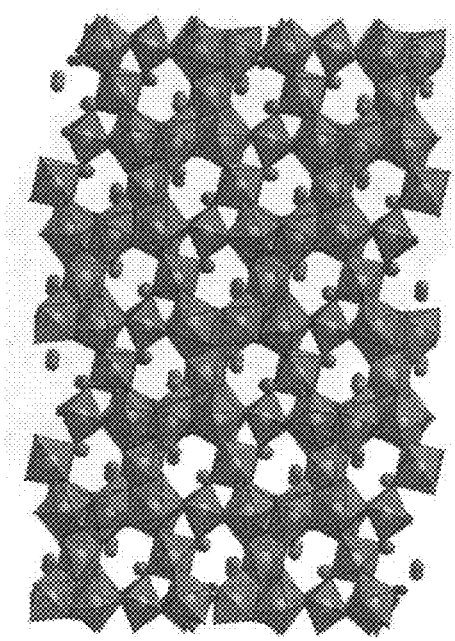
Figure 7F:
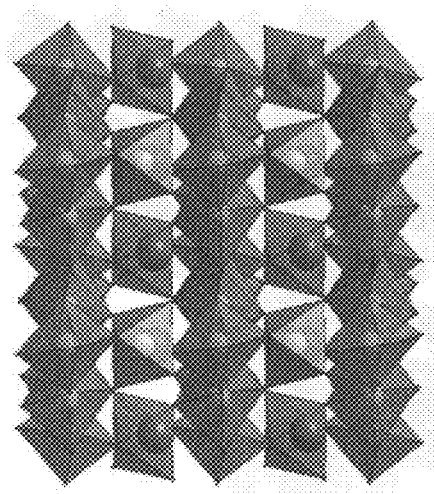
Figure 7G:
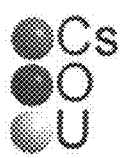
Figure 7G:
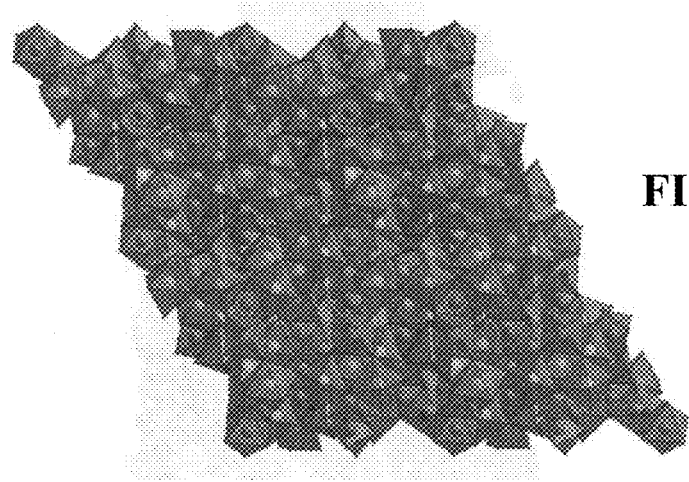

There are 4 known structures that have the chemical formula of $Cs_2U_4O_{12}$. Our $P2_1/c$ (space group) structure is the fifth structure and it is structurally different than the previously disclosed 4 structures. The space group, which denotes symmetry, for the previous structures are Pbcn, $P2_1$, R3-H, and Fd3-m. The Pbcn and $P2_1$ structures have only been refined to display the atomic coordinates of the cesium and uranium atoms. The structure data was too poor to resolve the location of the oxygen atoms. Therefore a visual display of the crystal structure for the Pbcn and $P2_1$ structures cannot be done. To contrast our new $P2_1/c$ structure versus the R3-H and Fd-3m structure Applicants have provided side by side comparisons of the structures as viewed down crystallographic axes of a, b and c. Because Fd3-m is cubic, the a, b, and c are symmetrically equivalent and thus I did not repeat that image in the b and c views. There uranium atoms have a polyhedral view with the oxygen for ease of view. FIGS. 7A through 7C depict, respectively, the a axis view of the $P2_1/c$, R3-H, and Fd3-m structures for $Cs_2U_4O_{12}$. FIGS. 7D and 7E depict, respectively, the b axis view of the $P2_1/c$, and R3-H structures for $Cs_2U_4O_{12}$ and FIGS. 7F and 7G depict, respectively, the b axis view of the $P2_1/c$, and R3-H structures for $Cs_2U_4O_{12}$. Such figures clearly demonstrate the difference in such structures.

Single Crystalline $Cs_2U_4O_{12}$

Applicants disclose single crystalline $Cs_2U_4O_{12}$ having a $P2_1/c$ symmetry structure.

Applicants disclose single crystalline $Cs_2U_4O_{12}$ according to Paragraph 0023, said single crystalline $Cs_2U_4O_{12}$ having the following coordinates:
  a) a cell length a of 7.9400(16);
  b) a cell length b of 7.3910(15);
  c) a cell length c of 13.253(4);
  d) a cell angle alpha of 90.00;
  e) a cell mangle beta of 124.77(2); and
  f) a cell angle gamma of 90.00.

Applicants disclose single crystalline $Cs_2U_4O_{12}$ according to Paragraph 0023 through 0024 having the following, coordinates:
  a) a Cs1 having x=0.42274(13), y=−0.49113(10) and z=−0.35792(8);
  b) a U1 having x=−0.00331(6), y=−0.29086(5) and z=−0.28709(4);
  c) a U2 having x=0.0000, y=−0.5000 and z=0.0000;
  d) a U3 having x=−0.5000, y=0.0000 and z=−0.5000;
  e) a O1 having x=−0.0211(12), y=−0.5887(11) and z=−0.3566(7)
  f) a O2 having x=−0.3071(12), y=−0.2431(10) and z=−0.3993(8)
  g) a O3 having x=0.2991(12), y=−0.3330(10) and z=−0.1697(7)
  h) a O4 having x=0.3320(12), y=−0.4520(11) and z=0.0664(7)
  i) a O5 having x=−0.0654(12), y=−0.4859(10) and z=−0.1819(7)
  j) a O6 having x=−0.0170(13), y=−0.2624(10) and z=−0.4681(8)

Process of Making Single Crystalline $Cs_2U_4O_{12}$

Applicants disclose process making a single crystalline $Cs_2U_4O_{12}$ having a $P2_1/c$ symmetry structure, said process comprising autoclaving for a period of from about 24 hours to about one year, preferably from about 14 days to about 180 days, more preferably from about 90 days to about 120 days, at a pressure of from about 200 psi to about 100,000 psi, preferably from about 10,000 psi to about 40,000 psi, more preferably from about 20,000 psi to about 25,000 psi, a container comprising an ampoule having a bottom feedstock zone and a top crystal growth zone, said bottom feedstock zone having a temperature range of from about 200° C. to 1000° C., preferably from about 300° C. to about 700° C., more preferably from about 350° C. to 450° C. and top crystal growth zone having a temperature range of from about 50° C. to 950° C., preferably from about 200° C. to about 600° C., more preferably from about 300° C. to 400° C., said process having a temperature gradient between said bottom feedstock zone and said top crystal growth zone of from about 1° C. to 130° C., preferably from about 25° C. to about 80° C., more preferably from about 40° C. to 60° C. and most preferably about 50° C.; said container comprising: 0.001-4.999:5 internal fill to ampoule volume, 0.01-8:4 feed stock to mineralizer, from 0.01:4 to 4:0.01 of each powdered feed stock; preferably: 2-4.5:5 internal fill to ampoule volume, 0.5-3:4 feed stock to mineralizer, from 1:4 to 4:1 of each powdered feed stock, more preferably 4:5 internal fill to ampoule volume, 1:4 feed stock to mineralizer, 1:1 of each powdered feed stock.

Applicants disclose a process according to Paragraph 0026 wherein said crystal growth zone of said container comprises a seed crystal, preferably said seed crystal is $Cs_2U_4O_{12}$, more preferably said seed crystal has a P21/c symmetry structure.

Applicants disclose a process according to Paragraph 0027 wherein said seed crystal has the following coordinates: the following coordinates:
  a) a cell length a of 7.9400(16);
  b) a cell length b of 7.3910(15);
  c) a cell length c of 13.253(4);
  d) a cell angle alpha of 90.00;
  e) a cell mangle beta of 124.77(2); and
  f) a cell angle gamma of 90.00.

The process according to Paragraph 0028 wherein said seed crystal has the following, coordinates:
  a) a Cs1 having x=0.42274(13), y=−0.49113(10) and z=−0.35792(8);
  b) a U1 having x=−0.00331(6), y=−0.29086(5) and z=−0.28709(4);
  c) a U2 having x=0.0000, y=−0.5000 and z=0.0000;
  d) a U3 having x=−0.5000, y=0.0000 and z=−0.5000;
  e) a O1 having x=−0.0211(12), y=−0.5887(11) and z=−0.3566(7)
  f) a O2 having x=−0.3071(12), y=−0.2431(10) and z=−0.3993(8)
  g) a O3 having x=0.2991(12), y=−0.3330(10) and z=−0.1697(7)
  h) a O4 having x=0.3320(12), y=−0.4520(11) and z=0.0664(7)
  i) a O5 having x=−0.0654(12), y=−0.4859(10) and z=−0.1819(7)
  j) a O6 having x=−0.0170(13), y=−0.2624(10) and z=−0.4681(8)

The process of Paragraph 0026 wherein said crystal growth zone of said container comprises a non-native seed crystal, preferably said seed crystal is $Al_2O_3$, Si, or Ge.

Figure 1:
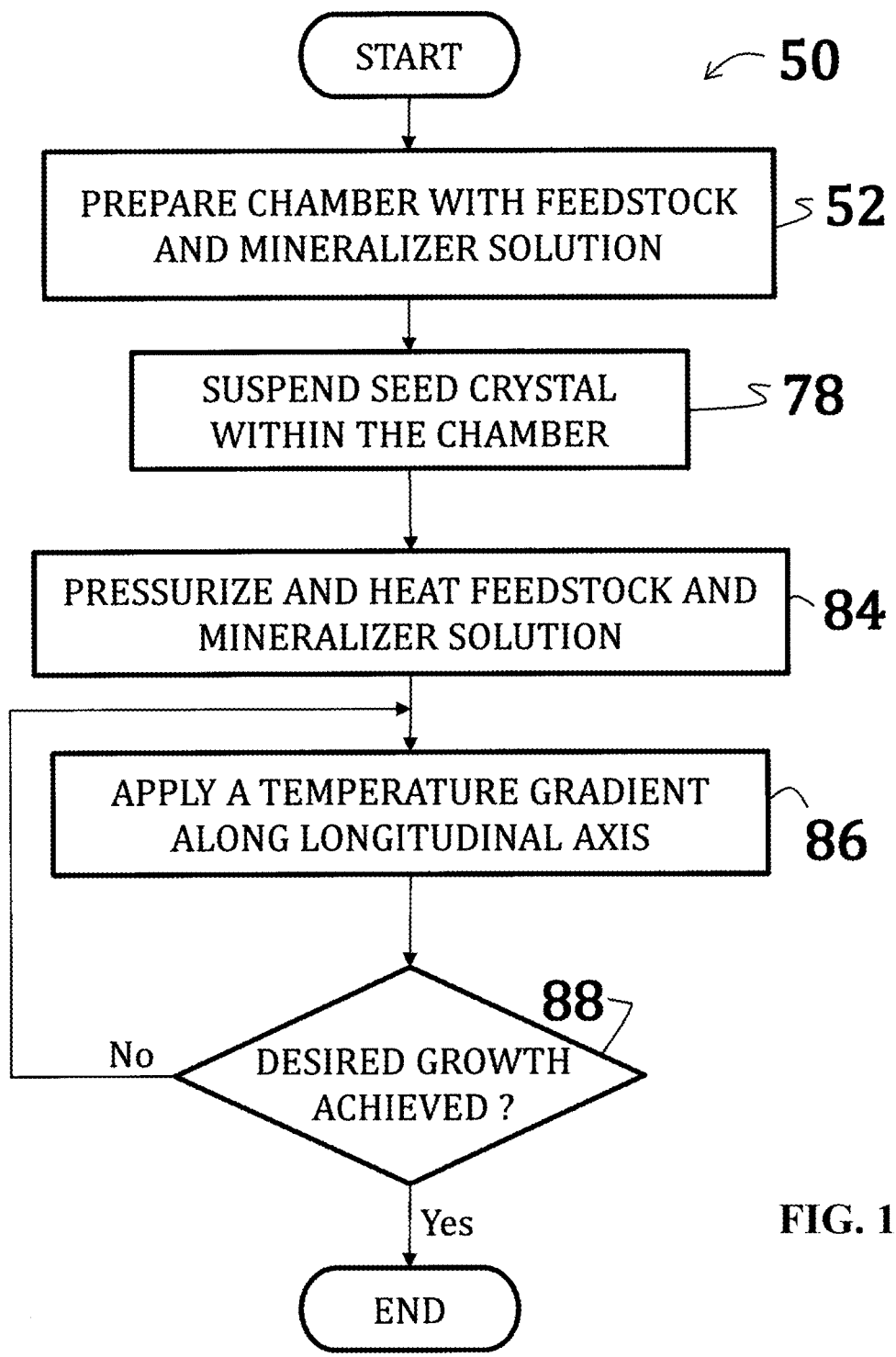
FIG. 1 is a flowchart illustrating a method of synthesizing uranium-based crystals in accordance with an embodiment of the present invention.

Referring now to the figures, and in particular to FIG. 1, a flowchart illustrating a method 50 of synthesizing single crystals according to an embodiment of the present invention is described. In Block 52, a chamber 54 within a pressurizable reaction device 56 (FIG. 2B) is prepared with a feedstock and a mineralizer solution (collectively illustrated as solution 57 in FIG. 2A).

Composition of the feedstock and the mineralizer solution depend, in part, of the desired crystal yielded. The feedstock may be powdered or polycrystalline and provide nutrient for crystal growth. For $Cs_2U_4O_{12}$ crystals, triuranium octoxide ($U_3O_8$), $Cs_2U_4O_{12}$ or uranium trioxide ($UO_3$) may be used. The mineralizer solution, generally used for dissolution of nutrient, formation of spuriously nucleated single crystals, or both, may be generally comprised of a cesium hydroxide, cesium halides, cesium carbonate, and mixtures thereof. Mineralizer solutions have concentrations ranging from about 0.1 M to about 30 M.

TABLE 1

| CRYSTAL | SEED CRYSTAL (if any) | FEEDSTOCK | MINERALIZER SOLUTION |
|---|---|---|---|
| $Cs_2U_4O_{12}$ | $Cs_2U_4O_{12}$, Non-native seeds including $Al_2O_3$, Si, Ge, etc. | $Cs_2U_4O_{12}$, $U_3O_8$ $UO_3$ | Cesium hydroxide Cesium halides Cesium carbonate |

Figure 2A:
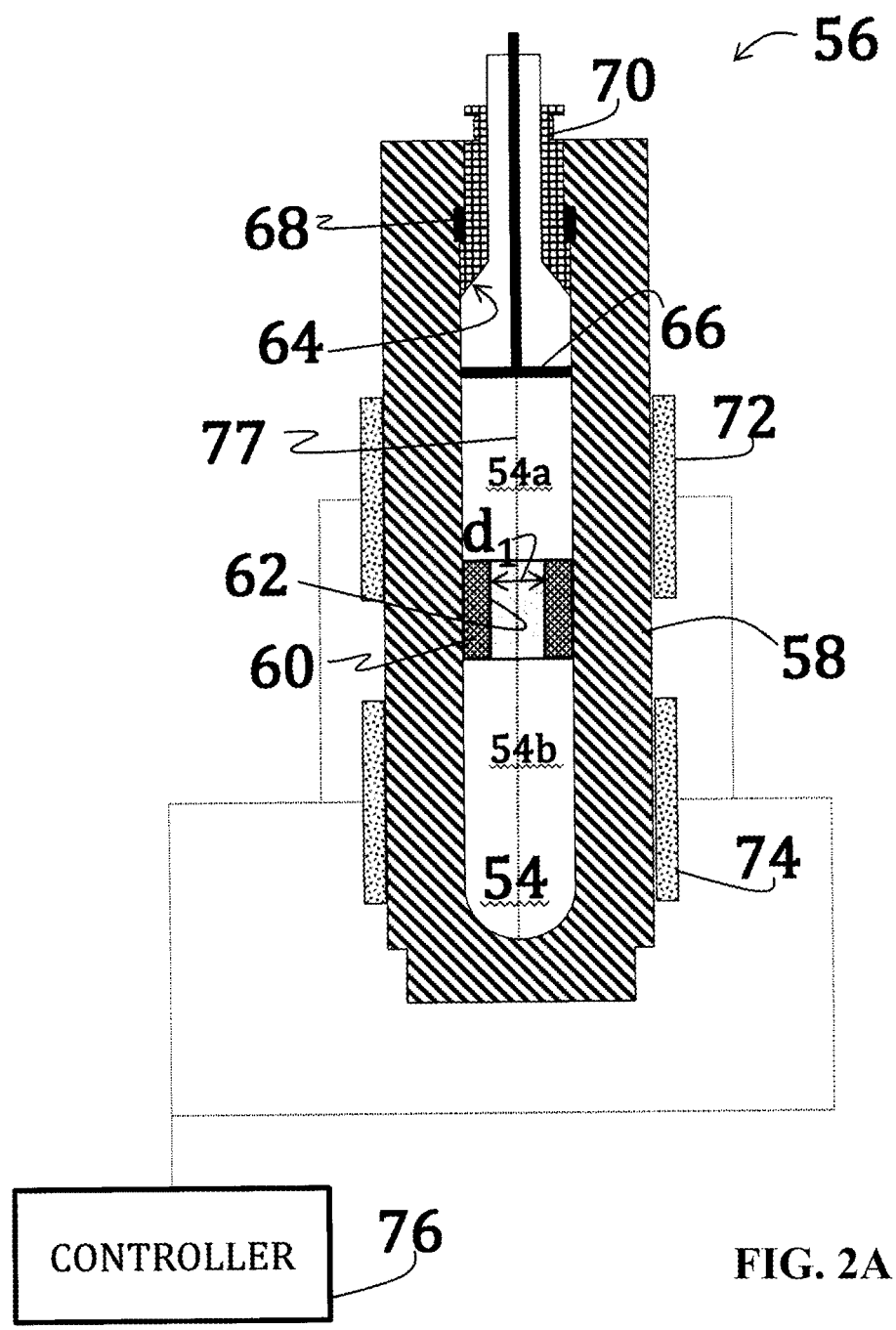
FIG. 2A is a side elevational view of an autoclave, shown in cross-section, suitable for performing the method of FIG. 1 according to embodiments of the present invention.
Figure 2B:
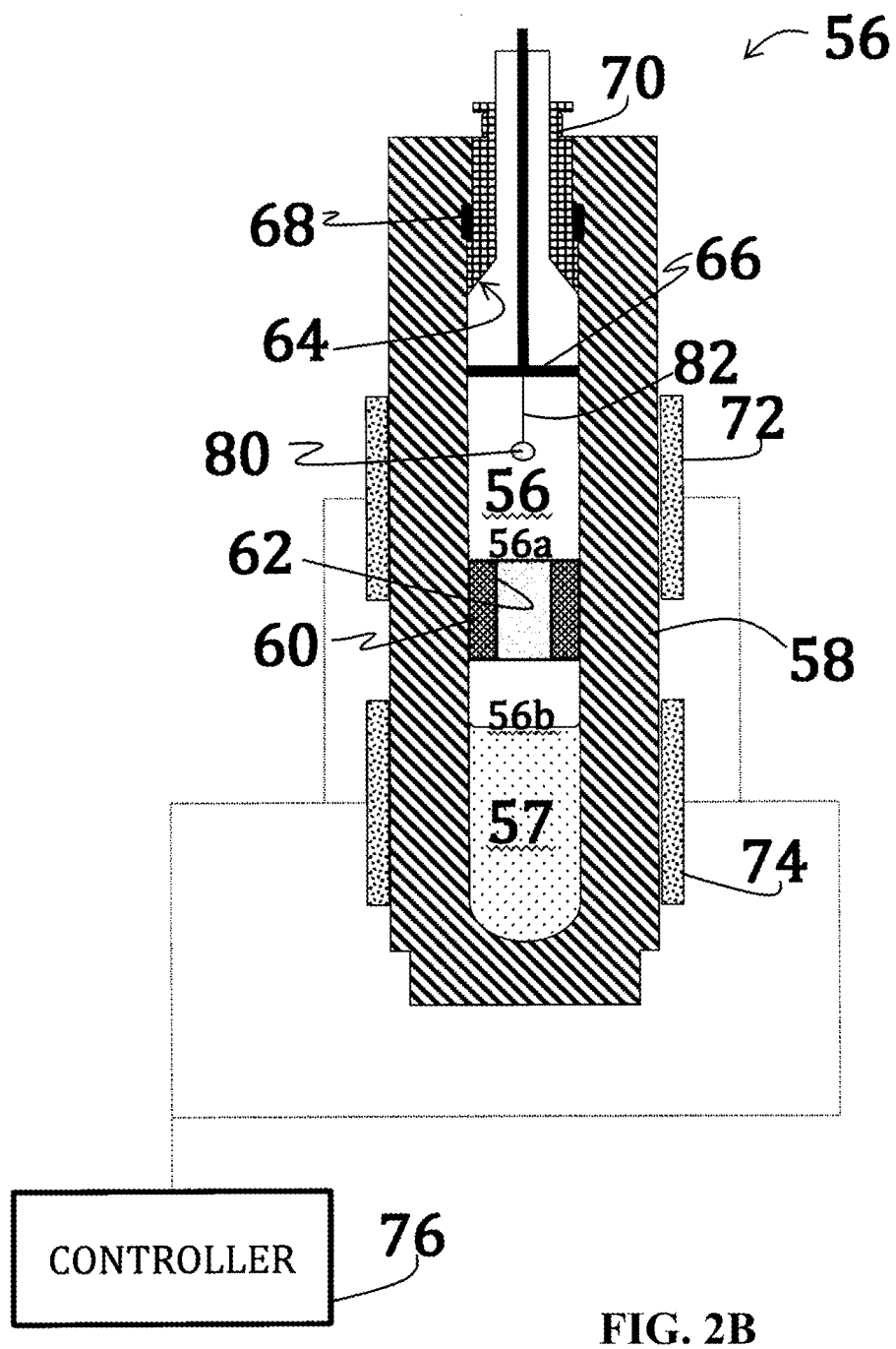
FIG. 2B is a side elevational view of an autoclave, shown in cross-section, suitable for performing the method of FIG. 1 according to embodiments of the present invention.

The exemplary pressurizable reaction device 56 illustrated in FIG. 2B is an autoclave; however, those skilled in the art having the benefit of the disclosure provided herein would readily appreciate that the illustrated structure is non-limiting. The autoclave 56 includes a wall 58 enclosing the chamber 54, which may be separated into upper and lower regions 54a, 54b by a baffle 60. The baffle 60 may be constructed from any inert material, for example, a precious metal, and includes an opening 62 therein having a diameter, $d_1$, selected to permit fluid communication there through ranging from about 15% to about 45%. In this way, the baffle 60 permits fluidic communication between the upper and lower regions 54a, 54b of the chamber 54 while maintaining these regions 54a, 54b as separate. Although the baffle 60 is illustrated as having a single opening 62, it would be readily understood that more than one opening may be used. In-fact, according to some embodiments of the present invention, the baffle 60 may be porous or comprise a mesh material, for example.

The chamber 54 is accessible through an open end 64, into which a plug 66 and seal 68 may be inserted before pressurizing the chamber 54 and secured with a locking collar.

Externally, heaters 72, 74 (two are shown) at least partially surround the wall 58 of the autoclave 56, each corresponding to a respective one of the upper and lower chambers 54a, 54b. The heaters 72, 74 are operably coupled to a controller 76, which may be configured to operably control the heaters 72, 74 such that the upper chamber 54a may be heated to a temperature that is different from a temperature of the lower chamber 54b. Said another way, the heaters 72, 74 may be operated so as to form a temperature gradient between the upper and lower chambers 54a, 54b. According to embodiments of the present invention, and as described in great detail below, with the thermal gradient ranging from about 1° C. to 130° C., preferably from about 25° C. to about 80° C., and more preferably from about 40° C. to 60° C.

The heaters 72, 74 may have any suitable structure, form, or number. Particularly, and as shown, band heaters 72, 74 are used to circumferentially surround the 58 and chamber 54 therein. Other constructions and methods may be used, so long as a temperature difference exists along a longitudinal axis 77 of the chamber 54 of the autoclave 56.

Referring again to FIG. 1, with reference to FIG. 2A, and with the feedstock and mineralizer solution (collectively illustrated as liquid 57) prepared within the chamber 54, a seed crystal 80 may then be suspended within the upper chamber 54a (Block 78). The crystal suspension 82 may include wires, clamps, and woven wire mesh constructed from an inert material, such as a precious metal.

If necessary, although not shown, de-ionized water may be added to the chamber 54 such that a total volume of solution 57 and water occupies about 40% to about 95% of the chamber's internal volume.

Continuing with FIGS. 1 and 2, the chamber 54 of the autoclave 56 may then be sealed, pressurized (for example, at a pressure of from about 200 psi to about 100,000 psi, preferably from about 10,000 psi to about 40,000 psi, more preferably from about 20,000 psi to about 25,000 psi), and heated (Block 84). In Block 86, a temperature gradient is formed along the longitudinal axis 77 of the chamber 54. In that the lower chamber 54b may be heated to a temperature range of from about 200° C. to 1000° C., preferably from about 300° C. to about 700° C., more preferably from about 350° C. to 450° C. This high temperature causes a partial amount of the uranium nutrient/feedstock to enter the mineralizer solution. Concurrently, the upper chamber 54a may be heated to a temperature range of from about 50° C. to 950° C., preferably from about 200° C. to about 600° C., more preferably from about 30° C. to 400° C., but less than the temperature of the lower chamber 54b. At the lower temperature, the solubility of nutrient in the mineralizer solution is reduced and, resultantly, nutrient will precipitate out of solution and spontaneously grow crystals onto the seed crystal 80 (FIG. 2A). More generally, the maximum temperature may range from about 400° C. to about 750° C., with the thermal gradient ranging from about 1° C. to 130° C., preferably from about 25° C. to about 80° C., and more preferably from about 40° C. to 60° C.

Heating and crystallization continue ("No" branch of decision block 88) until a final crystal is achieved and having one or more of a desired purity, a desired quality, and a desired size. While these characteristics of the final crystal are at least partially dependent on reaction duration, generally crystal growth continues for about 7 days to about 90 days.

When the desired growth is achieved ("Yes" branch of decision block 88), the process ends, the heat and pressure are removed from the chamber 54 such that crystal may be retrieved.

According to some alternative embodiments, the thermal gradient need not be applied nor maintained. Instead, crystal growth may be found favorable using an isothermal temperature.

Figure 3:
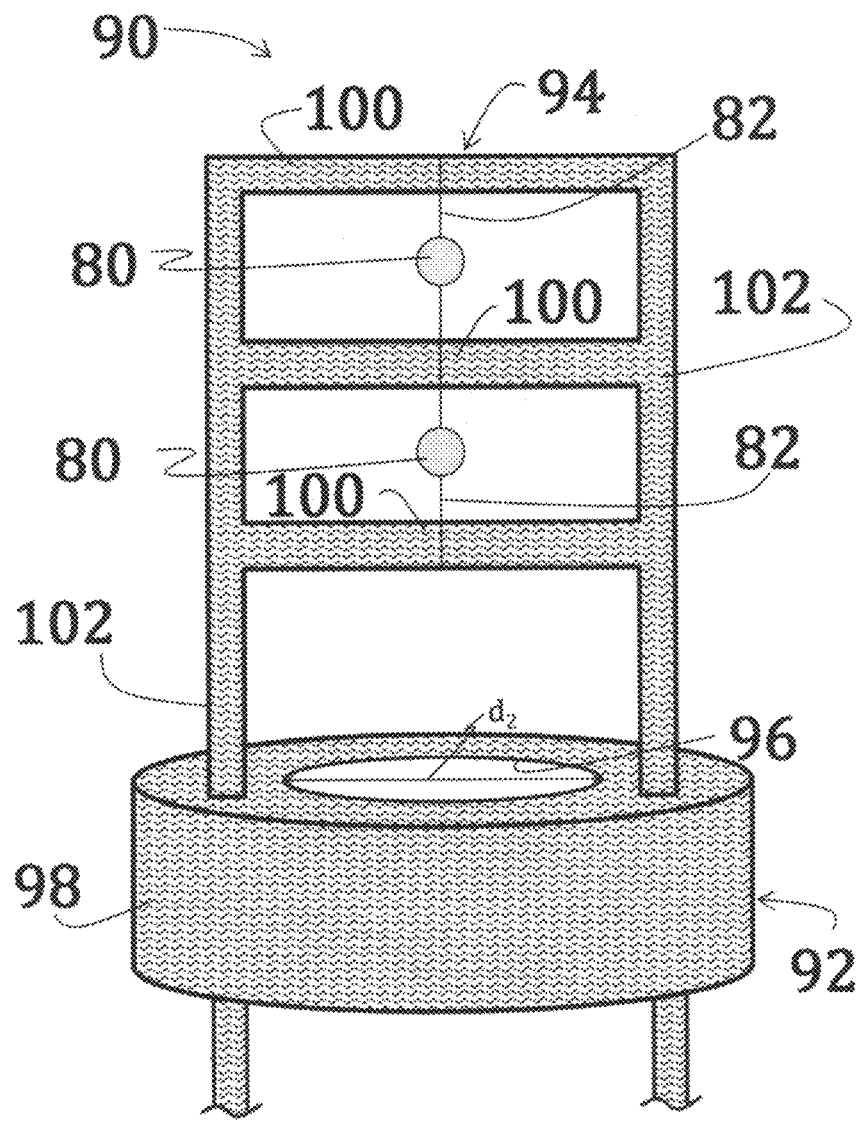
FIG. 3 is a side elevational view of a seed rack ladder suitable for use in synthesizing uranium oxide crystals in accordance with some embodiments of the present invention.

According to some embodiments of the present invention, the use of one or more seed crystal 80 may be required or desired. In that regard, and with reference to FIG. 3, a baffle-based seed ladder 90 is shown. The baffle-based seed ladder 90 includes a baffle portion 92 and a ladder portion 94 and, thus, may comprise a unitary construction or, alternatively, may be separately constructed and joined together. As was noted above, the construction may include any inert material, for example, precious metals.

The baffle portion 94 includes an opening 96 within a main body 98 having a diameter, $d_2$, selected to permit fluid communication there through ranging from about 15% to about 45% and so as to permit fluidic communication between the upper and lower regions 54a, 54b (FIG. 2A) of the chamber 54 (FIG. 2A) while maintaining these regions 54a, 54b (FIG. 2A) as separate.

The ladder portion 94 includes a one or more rungs 100 (three rungs 100 are shown) extending from vertical supports 102. Seed crystals 80 (two seed crystals 80 are shown) are positioned between adjacent ones of the rungs 100 by at least one suspension 82, which may be similar to the suspensions discussed in detail above.

Use of the baffle-based seed ladder 90 may provide the benefit of growing more than one crystal at a time in accordance with embodiments of the present invention as described in detail here.

Figure 4:
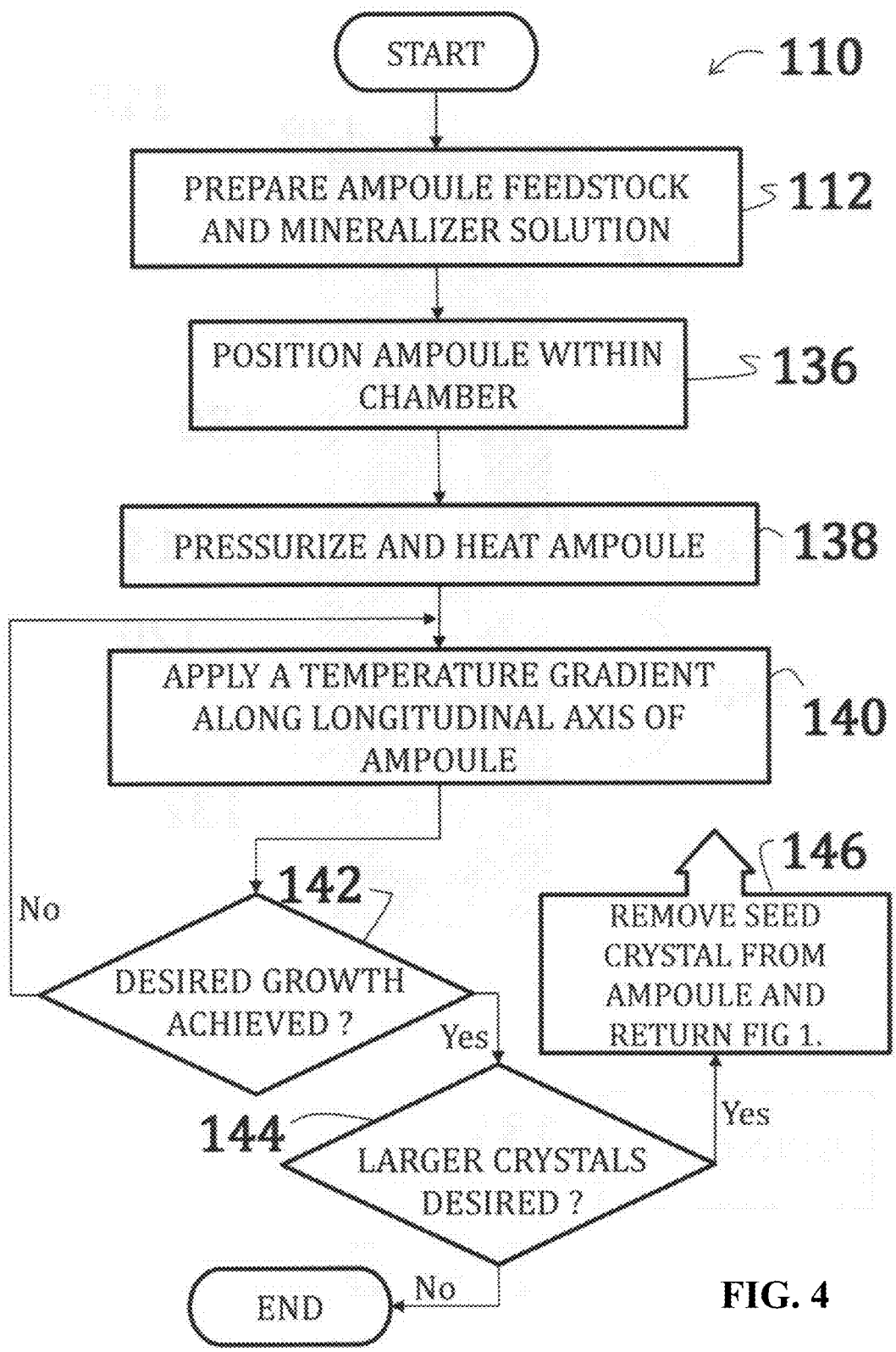
FIG. 4 is a flowchart illustrating a method of synthesizing uranium-based seed crystals in accordance with another embodiment of the present invention.
Figure 5:
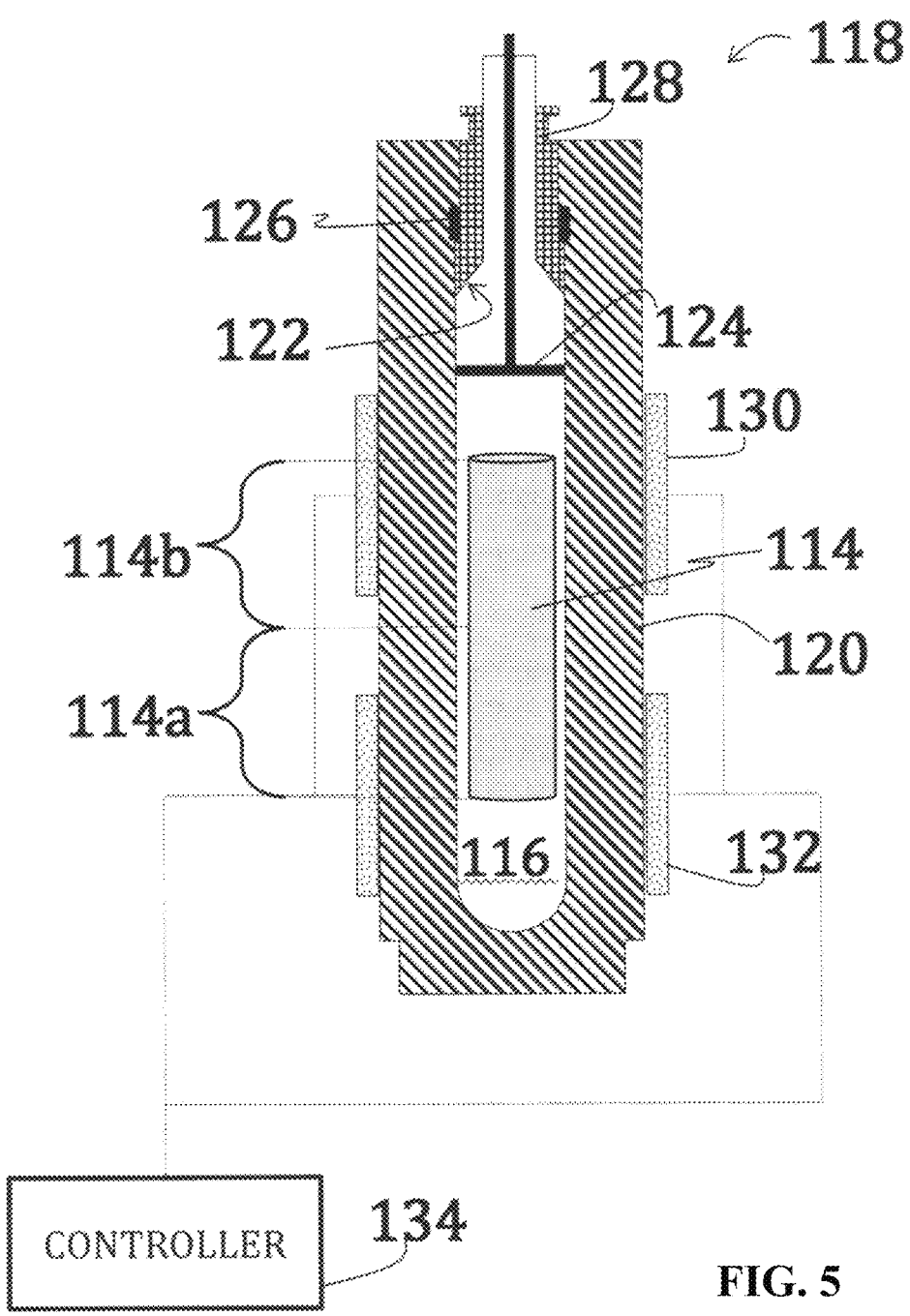
FIG. 5 is a side elevational view of an autoclave, shown in cross-section, suitable for performing the method of FIG. 4 according to embodiments of the present invention.

Turning now to FIGS. 4 and 5, a method of forming crystals according to another embodiment of the present invention is shown. In Block 112, an ampoule 114 configured to be positioned within a chamber 116 of a pressurizable reaction device 118 is prepared with a feedstock and a mineralizer solution. As described previously, the composition of the feedstock and the mineralizer solution depends, in part, of the desired crystal yielded and may be selected in accordance with the parameters set forth above. Again, mineralizer solutions may have concentrations ranging from about 0.1 M to about 30 M.

The exemplary pressurizable reaction device 118 illustrated in FIG. 5 is similar to the autoclave 56 of FIG. 2B; however, those skilled in the art having the benefit of the disclosure provided herein would readily appreciate that the illustrated structure is non-limiting. Here, the device 118 includes a wall 120 enclosing the chamber 116. The chamber 116 is accessible through an open end 122, into which a plug 124 and seal 126 may be inserted before pressurizing the chamber 116 and secured with a locking collar 128.

Externally, heaters 130, 132 (two are shown), similar to those described above, at least partially surround the wall 120 of the device 118. The heaters 130, 132 may be operably controlled by a controller 134 such a temperature gradient is created along a longitudinal axis 77 (FIG. 2A) of the chamber 116. According to embodiments of the present invention, and as described in great detail below, the temperature gradient variation may range from about 1° C. to 130° C., preferably from about 25° C. to about 80° C., and more preferably from about 40° C. to 60° C.

The ampoule 114 may be constructed of a precious metal (silver, gold, platinum, or palladium, for example) and, according to some embodiments of the present invention, may comprise a metal tubing, such as those commercially-available from by Refining Systems, Inc. (Las Vegas, Nev.) and having one end welded or otherwise closed to retain the feedstock and the mineralizer solution therein.

Referring again to Block 112, the feedstock and the mineralizer solution are added to the ampoule 114 until a combined total of the feedstock and mineralizer solution within the ampoule is set to occupy a majority percentage (ranging from about 40% to about 90%) of the ampoule's total volume. The ampoule 114 may then be sealed (for example, by welding any open end) and is positioned within the chamber 116 of the device 118 of FIG. 5 (Block 136). If necessary, although not shown, de-ionized water may be added to the chamber 116 such that a total volume of ampoule 114 and water occupies about 65% to about 90% of the chamber's internal volume.

Continuing with FIGS. 4 and 5, the chamber 116 of the device 118 may then be sealed, pressurized (for example, at a pressure of from about 200 psi to about 100,000 psi, preferably from about 10,000 psi to about 40,000 psi, more preferably from about 20,000 psi to about 25,000 psi), and heated (Block 138). In Block 140, a temperature gradient is formed along the longitudinal axis 77 (FIG. 2A) of the chamber 116, which may generally coincide with a longitudinal axis (not shown) of the ampoule 114. In that regard, the ampoule 114 will have a lower region 114a heated to a temperature that is greater than a temperature of an upper region 114b. It should be readily appreciated that the terms "lower" and "upper" are merely used as directional reference herein with respect to FIG. 5 and should not be considered to be limiting.

According to some embodiments, the highest temperature of the ampoule 114 at the lower region 114a will be a temperature range of from about 50° C. to 950° C., preferably from about 200° C. to about 600° C., more preferably from about 300° C. to 400° C., but greater than the temperature of the lower chamber 114b. At this high temperature, uranium nutrient/feedstock enters the mineralizer solution. The upper region 114b may then heated to a temperature range of from about 50° C. to 950° C., preferably from about 200° C. to about 600° C., more preferably from about 300° C. to 400° C., but less than the temperature of the lower chamber 114a. At the lower temperature, the solubility of nutrient in the mineralizer solution is reduced and, resultantly, nutrient will precipitate out of solution and spontaneously form spontaneously crystals on an inner wall (not shown) of the ampoule 114).

Heating and crystallization continue ("No" branch of decision block 142) until a desired growth is achieved. While the final size of the crystal is dependent on reaction duration, generally crystal growth continues for about for a period of from about 24 hours to about one year, preferably from about 14 days to about 180 days, more preferably from about 90 days to about 120 days.

When the desired growth is achieved ("Yes" branch of decision block 142), a decision is made as to whether larger crystals are desired (Decision block 144). If larger crystals are desired ("Yes" branch of decision block 144), then heat and pressure are removed from the chamber 116, the ampoule 114 opened, and a small crystal may be extracted from the inner wall of the ampoule 114 (Block 146). The small, extracted crystal may then be used as a seed crystal in the method 50 (FIG. 1) described above. Otherwise ("No" branch of decision block 144), the process ends, the heat and pressure are removed from the chamber 116 and the ampoule 114 opened such that crystals may be retrieved.

Figure 6:
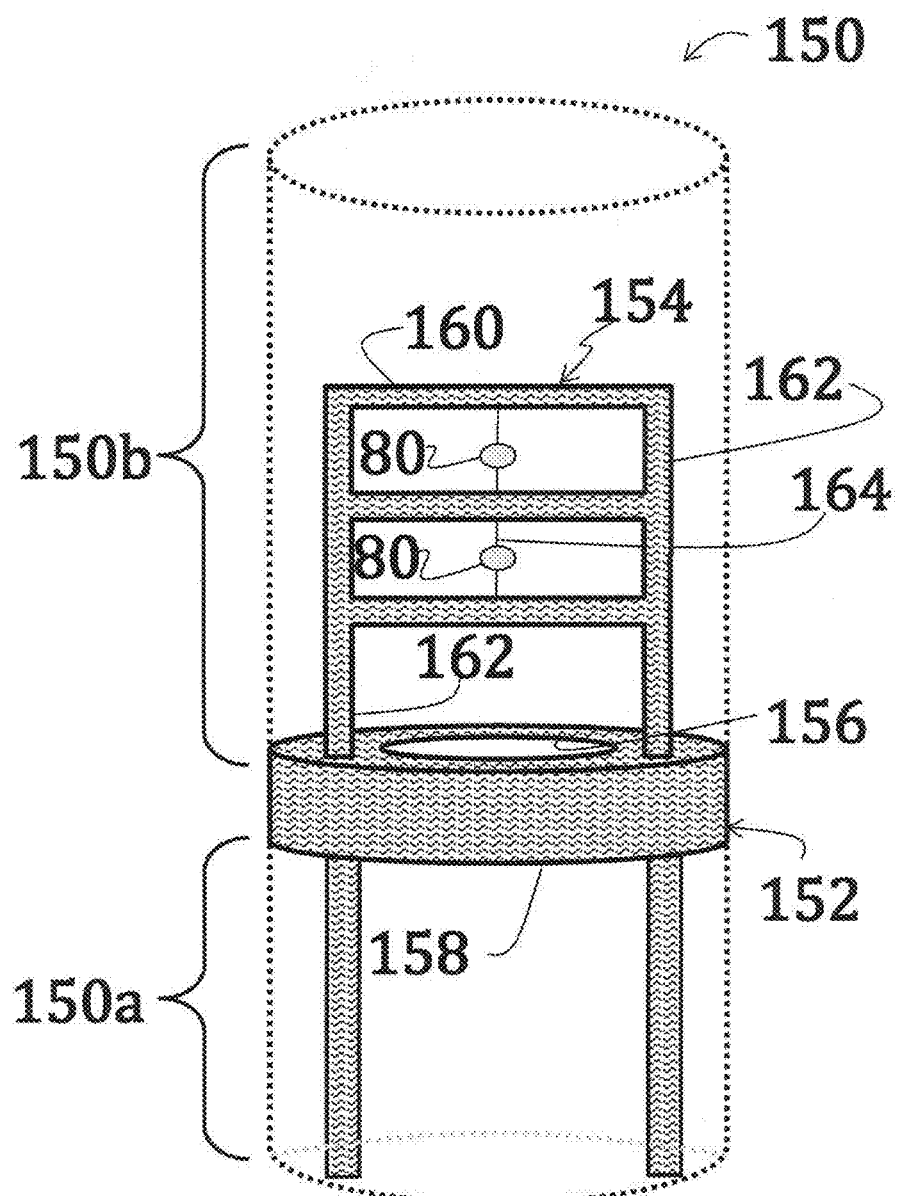
FIG. 6 is a side elevational view of an exemplary ampoule suitable for use in synthesizing uranium oxide crystals in accordance with some embodiments of the present invention.

Similar to the alternate embodiment described above, an ampoule 150, used in accordance with methods described herein, may further comprise a baffle 152, with or without a seed ladder 154, the latter of which is shown in FIG. 6 (the ampoule 150 being in phantom). The baffle 152 with ladder 154 may comprise a unitary construction of an inert material (such as a precious metal) or, alternatively, may be separately constructed and joined together. As was noted above, the construction may include any inert material, for example, precious metals.

The baffle 152 includes an opening 156 within a main body 158 having a diameter selected to permit fluid communication there through ranging from about 15% to about 45% and so as to permit fluidic communication between the upper and lower regions 150b, 150a of the ampoule 150 while maintaining these regions 150b, 150a as separate.

The seed ladder 154 includes a one or more rungs 160 (three rungs 160 are shown) extending from vertical supports 162. Seed crystals 80 (two seed crystals 80 are shown) are positioned between adjacent ones of the rungs 160 by at least one suspension 164, which may be similar to the suspensions discussed in detail above. In this way, more than one seed crystal 80 may be used for growing crystals.

Test Methods

Method of determining crystal structure. For purpose of this specification, a Rigaku XtaLab Mini is used to generate the data needed to determine crystal. The software used to collect the data and integrate it is Crystal Clear Expert 2.0 r14. The final crystal structure is solved using Shelxtl Version 6.10. The following coordinates are obtained via this method:
cell length a;
cell length b;
cell length c;
cell angle alpha;
cell mangle beta;
cell angle gamma and
x, y and z coordinates for Cs1, U1, U2, U3, O1, O2, O3, O4, O5 and O6.

EXAMPLES

The following examples illustrate particular properties and advantages of some of the embodiments of the present invention. Furthermore, these are examples of reduction to practice of the present invention and confirmation that the principles described in the present invention are therefore valid but should not be construed as in any way limiting the scope of the invention.

Example 1 Bulk single crystal $Cs_2U_4O_{12}$ by the hydrothermal technique. Utilizing two distinct temperature regimes $UO_3$ feedstock is dissolved into a mineralizing solution (CsOH), transported via convective flow to the cooler region. The cooler region, having a lower solubility limit than that of the hotter region, promotes precipitation of $Cs_2U_4O_{12}$. The precipitates can nucleate either spontaneously (SN) on the wall of the ampule, or via transport growth on a seed crystal. Growth conditions utilized a 1.25" internal diameter autoclave constructed from Inconel 718. A sealed, 0.25" internal diameter silver tube with the reactants was loaded into the autoclave and counter pressure water was added to the autoclave to prevent the silver tubing from rupturing. The silver tube had an overall length of 4 inches. The interior of the silver tube had ~0.05 grams of powder $UO_3$ and 0.05 g powder ZnS feedstock added to the bottom section of the tube. 0.4 ml of 6M CsOH was added to the tube prior to sealing (welding) it shut. The fully assembled silver reaction tube was then loaded into the autoclave. Three external band heaters were affixed to the autoclave, which enabled control of a thermal gradient. The bottom band heater, which corresponds with the feedstock zone was held at 400° C. The middle band heater, which corresponds with the seed zone was held at 350° C. The upper band heater extend above the silver tube and was held at 350° C. The application of the temperature generated 20-25 kpsi of pressure. These conditions were maintained for 10 days. Once the ampule was removed from the autoclave and opened, the remaining contents of the ampule were collected on a filter paper underneath. The process yielded a $Cs_2U_4O_{12}$ crystal having a size of 300 microns. Such $Cs_2U_4O_{12}$ was analyzed in accordance with the test method for determining crystal structure as found in Paragraph 0059 of this specification and found to have a $P2_1/c$ symmetry structure and the following coordinates:
a cell length a of 7.9400(16); a cell length b of 7.3910(15); a cell length c of 13.253(4); a cell angle alpha of 90.00; a cell mangle beta of 124.77(2); and a cell angle gamma of 90.00; and the following x, y and z coordinates:

| Atom | X | Y | Z |
| --- | --- | --- | --- |
| Cs1 | 0.42274(13) | −0.49113(10) | −0.35792(8) |
| U1 | −0.00331(6) | −0.29086(5) | −0.28709(4) |
| U2 | 0.0000 | −0.5000 | 0.0000 |
| U3 | −0.5000 | 0.0000 | −0.5000 |
| O1 | −0.0211(12) | −0.5887(11) | −0.3566(7) |
| O2 | −0.3071(12) | −0.2431(10) | −0.3993(8) |
| O3 | 0.2991(12) | −0.3330(10) | −0.1697(7) |
| O4 | 0.3320(12) | −0.4520(11) | 0.0664(7) |
| O5 | −0.0654(12) | −0.4859(10) | −0.1819(7) |
| O6 | −0.0170(13) | −0.2624(10) | −0.4681(8) |

Example 2 Bulk single crystal $Cs_2U_4O_{12}$ by the hydrothermal technique using a seed crystal. The process of Example 1 is repeated accept a portion of the $Cs_2U_4O_{12}$ produced in Example 1 is used as a seed crystal.

Example 3 Bulk single crystal $Cs_2U_4O_{12}$ by the hydrothermal technique using a non-native seed crystal. The process of Example 1 is repeated accept a non-native seed crystal. Suitable non-native seed crystals include $Al_2O_3$, Si, Ge, etc.

Every document cited herein, including any cross referenced or related patent or application and any patent application or patent to which this application claims priority or benefit thereof, is hereby incorporated herein by reference in its entirety unless expressly excluded or otherwise limited. The citation of any document is not an admission that it is prior art with respect to any invention disclosed or claimed herein or that it alone, or in any combination with any other reference or references, teaches, suggests or discloses any such invention. Further, to the extent that any meaning or definition of a term in this document conflicts with any meaning or definition of the same term in a document incorporated by reference, the meaning or definition assigned to that term in this document shall govern.

While the present invention has been illustrated by a description of one or more embodiments thereof and while these embodiments have been described in considerable detail, they are not intended to restrict or in any way limit the scope of the appended claims to such detail. Additional advantages and modifications will readily appear to those skilled in the art. The invention in its broader aspects is therefore not limited to the specific details, representative apparatus and method, and illustrative examples shown and described. Accordingly, departures may be made from such details without departing from the scope of the general inventive concept.

What is claimed is:

1. A single crystalline $Cs_2U_4O_{12}$ having a $P2_1/c$ symmetry structure.

2. A process making a single crystalline $Cs_2U_4O_{12}$ having a $P2_1/c$ symmetry structure, said process comprising autoclaving for a period of from about 24 hours to about one year, at a pressure of from about 200 psi to about 100,000 psi, a container comprising an ampoule having a bottom feedstock zone and a top crystal growth zone, said bottom feedstock zone having a temperature range of from about 200° C. to 1000° C., and top crystal growth zone having a temperature range of from about 50° C. to 950° C., said process having a temperature gradient between said bottom feedstock zone and said top crystal growth zone of from about 1° C. to 130° C.; said container comprising: 0.001-4.999:5 internal fill to ampoule volume, 0.01-8:4 feed stock to mineralizer, from 0.01:4 to 4:0.01 of each powdered feed stock.

3. A process making a single crystalline $Cs_2U_4O_{12}$ having a $P2_1/c$ symmetry structure according to claim 2, said process comprising autoclaving for a period of from about from about 14 days to about 180 days, at a pressure of from about 10,000 psi to about 40,000 psi, a container comprising an ampoule having a bottom feedstock zone and a top crystal growth zone, said bottom feedstock zone having a temperature range of from about 300° C. to about 700° C. and top crystal growth zone having a temperature range of from about 200° C. to about 600° C., said process having a temperature gradient between said bottom feedstock zone and said top crystal growth zone of from about 25° C. to about 80° C.; said container comprising: 2-4.5:5 internal fill to ampoule volume, 0.5-3:4 feed stock to mineralizer, from 1:4 to 4:1 of each powdered feed stock.

4. A process making a single crystalline $Cs_2U_4O_{12}$ having a $P2_1/c$ symmetry structure according to claim 3, said process comprising autoclaving for a period of from about 90 days to about 120 days, at a pressure of from about 20,000 psi to about 25,000 psi, a container comprising an ampoule having a bottom feedstock zone and a top crystal growth zone, said bottom feedstock zone having a temperature range of from about 350° C. to 450° C. and top crystal growth zone having a temperature range of from about 300° C. to 400° C., said process having a temperature gradient between said bottom feedstock zone and said top crystal growth zone of from about 40° C. to 60° C.; said container comprising: 4:5 internal fill to ampoule volume, 1:4 feed stock to mineralizer, 1:1 of each powdered feed stock.

5. The process of claim 2 wherein said crystal growth zone of said container comprises a seed crystal.

6. The process of claim 5 wherein said crystal growth zone of said container comprises a $Cs_2U_4O_{12}$, seed crystal.

7. The process of claim 6 wherein said seed crystal has a P21/c symmetry structure.

8. The process of claim 2 wherein said crystal growth zone of said container comprises a non-native seed crystal.

9. The process of claim 8 wherein said non-native seed crystal is $Al_2O_3$, Si, or Ge.

\* \* \* \* \*